United States Patent
Kang et al.

(10) Patent No.: US 8,709,844 B2
(45) Date of Patent: Apr. 29, 2014

(54) LIGHT EMITTING DIODE PACKAGE AND METHOD OF FABRICATING THE SAME

(75) Inventors: Sin-Ho Kang, Gyeongsangbuk-do (KR); Tae-Hun Kim, Gyeongsangbuk-do (KR); Seung-Ho Jang, Gyeonggi-do (KR); Kyoung-Bo Han, Gyeonggi-do (KR); Jae-yong Choi, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 48 days.

(21) Appl. No.: 12/972,529

(22) Filed: Dec. 20, 2010

(65) Prior Publication Data

US 2011/0147779 A1 Jun. 23, 2011

(30) Foreign Application Priority Data

Dec. 21, 2009 (KR) .................. 10-2009-0127788

(51) Int. Cl.
*H01L 21/00* (2006.01)
*H01L 27/15* (2006.01)

(52) U.S. Cl.
USPC .............. 438/29; 438/22; 438/23; 438/24; 438/25; 438/26

(58) Field of Classification Search
USPC ................... 257/76, 98; 219/121.6
See application file for complete search history.

(56) References Cited

U.S. PATENT DOCUMENTS

| | | | |
|---|---|---|---|
| 6,331,459 B1 | 12/2001 | Gruening | |
| 2003/0010986 A1* | 1/2003 | Lin et al. | 257/79 |
| 2006/0060867 A1 | 3/2006 | Suchiro | |
| 2008/0061314 A1 | 3/2008 | Liaw et al. | |
| 2010/0019247 A1* | 1/2010 | Joichi et al. | 257/76 |
| 2010/0309057 A1* | 12/2010 | Edge et al. | 342/451 |
| 2011/0140142 A1 | 6/2011 | Won et al. | |
| 2011/0309057 A1* | 12/2011 | Lin | 219/121.63 |

FOREIGN PATENT DOCUMENTS

| | | | | |
|---|---|---|---|---|
| CN | 1747192 | | 3/2006 | |
| KR | 10-2005-0042608 | * | 5/2005 | ............ H01L 33/00 |
| KR | 1020050042608 | * | 5/2005 | ............ H01L 33/00 |
| KR | 10-0638824 | | 10/2006 | |
| KR | 10-2007-0103139 | | 10/2007 | |
| KR | 10-0880638 | | 1/2009 | |
| KR | 10-0888815 B1 | | 3/2009 | |
| TW | 200814362 | | 3/2008 | |
| TW | 2009-39522 | | 9/2009 | |
| WO | 2008041770 A1 | | 4/2008 | |

OTHER PUBLICATIONS

Office Action dated Jul. 25, 2013 from the Taiwan Intellectual Property Office in counterpart Taiwanese application No. 099139932.

(Continued)

*Primary Examiner* — Colleen Matthews
*Assistant Examiner* — William Harriston
(74) *Attorney, Agent, or Firm* — Morgan, Lewis & Bockius LLP

(57) ABSTRACT

A light emitting diode (LED) package and a method of manufacturing a LED package is provided. The LED package includes a case having first and second lead frames disposed through the case; an LED chip disposed on the case, the LED chip having first and second electrodes directly connected to the first and second lead frames through a eutectic bond, respectively; and a lens disposed over the case covering the LED chip.

11 Claims, 7 Drawing Sheets

(56) References Cited

OTHER PUBLICATIONS

Office Action dated Oct. 11, 2012 from the State Intellectual Property Office of China in a counterpart Chinese application.

Office Action dated Oct. 15, 2012 from the Korean Patent Office in a counterpart Korean application.

Chen, et al., Eutectic Die Bonding Technology and Its Applications in MEMS Packing, Semiconductor Optoelectronics, vol. 25, No. 6, Dec. 31, 2004, pp. 484-488.

* cited by examiner

LIGHT EMITTING DIODE PACKAGE AND METHOD OF FABRICATING THE SAME

The present application claims the benefit of Korean Patent Application No. 10-2009-0127788, filed in Korea on Dec. 21, 2009, which is hereby incorporated by reference.

BACKGROUND OF THE INVENTION

1. Field of the Invention

The present invention relates to a light emitting diode (LED) package, and more particularly, to an LED package being capable of preventing problems during a bonding process and a method of fabricating the LED package.

2. Discussion of the Related Art

Recently, LEDs are widely used because their characteristic of small size, low power consumption and high reliability. For example, LEDs are used for electric illumination and light sources in display devices. Particularly, to replace fluorescent lamps, LEDs that emits white light can be used. LEDs that emit white light are also being introduced for backlight units in liquid crystal display (LCD) devices.

FIG. 1 is a cross-sectional view of a related art LED package. As shown in FIG. 1, the LED package 10 includes an LED chip 20 for emitting light, a case 30 as a housing, fluorescent particles 40, first and second electrode leads 50a and 50b, a heat-transfer body 60, a pair of wires 70 and a lens 80. The lens 80 covers the LED chip 20 and the fluorescent particle 40.

The LED chip 20 is disposed on the heat-transfer body 60. The heat-transfer body 60 has a space. The space of the heat-transfer body 60 is covered with the case 30 and is packed with the fluorescent particles 40. The first and second electrode leads 50a and 50b are disposed through the heat-transfer body 60, and one end of each of the first and second electrode leads 50a and 50b protrudes from the case 30 to be electrically connected to an exterior current supplying unit (not shown) to receive a driving current for the LED chip 20. The other end of each of the first and second electrode leads 50a and 50b is respectively electrically connected to the LED chip 20 through the wires 70. The lens 80 covers the LED chip 20, the fluorescent particles 40, the heat-transfer body 60 and the wires 70, and controls an angle of light from the LED chip 20.

When the driving current is applied to the LED chip 20, the LED chip 20 emits light. The light from the LED chip 20 mixes with light from the fluorescent particles 40 to produce white light. Thus, white light is emitted through the lens 80.

The LED package 10 requires the wires 70 to provide the driving current from the exterior current supplying unit to the LED chip 20. Unfortunately, there can be an open defect on the wires 70. In addition, since the wires 70 are positioned at a path of the light from the LED chip 20, luminescent efficiency of the LED package 10 is decreased. Furthermore, a bonding process, for example, a soldering process, is required for connecting the wires 70 to the LED chip 20. The bonding process is very complicated such that processing yield is also decreased.

SUMMARY OF THE INVENTION

Accordingly, the present invention is directed to an LED package and a method of fabricating the LED package that substantially obviate one or more of the problems due to limitations and disadvantages of the related art.

An object of the present invention is to improve lamination efficiency of an LED package.

Another object of the present invention is to prevent problems during a bonding process for an LED package.

To achieve these and other advantages and in accordance with the purpose of the present invention, as embodied and broadly described, a light emitting diode (LED) package comprises a case having first and second lead frames disposed through the case; an LED chip disposed on the case, the LED chip having first and second electrodes directly connected to the first and second lead frames through a eutectic bond, respectively; and a lens disposed over the case covering the LED chip.

In another aspect, a method of fabricating a light emitting diode (LED) package comprises forming a case having first and second lead frames on a surface thereof; forming a LED chip having a transparent substrate, a LED structure, a first electrode and a second electrode; positioning the LED chip on the case such that the first and second electrodes directly contact the first and second lead frames; irradiating electromagnetic radiation onto the contact portion between the first electrode and the first lead frame as well as the second electrode and the second lead frame to generate eutectic bonding.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 2:
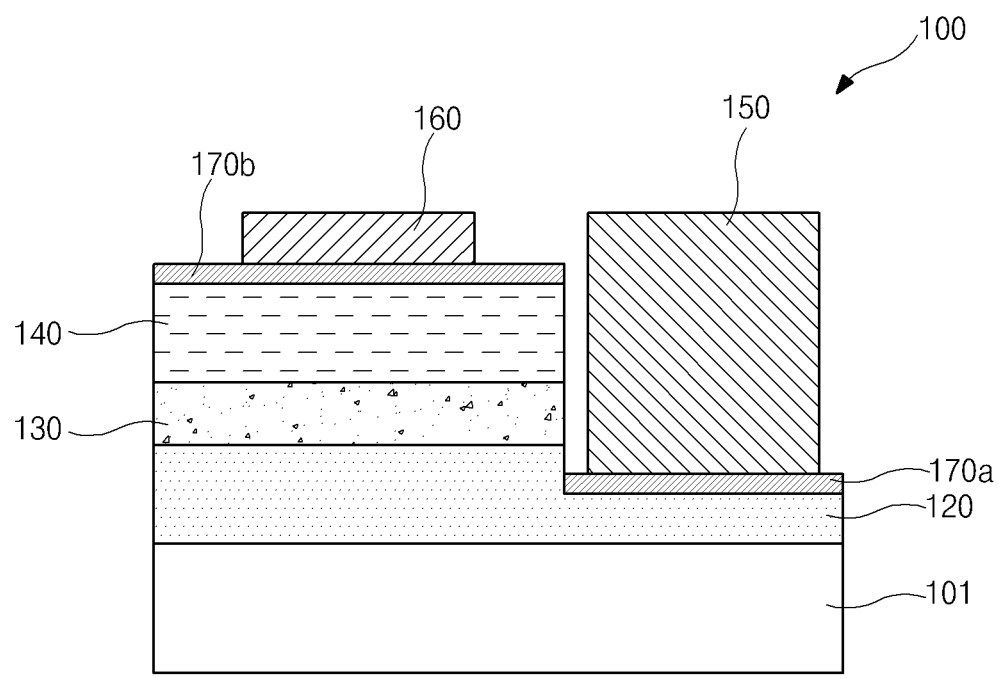
FIG. 2 is a schematic cross-sectional view of an LED chip according to an exemplary embodiment of the present invention.

FIG. 2 is a schematic cross-sectional view of an LED chip according to an exemplary embodiment of the present invention. As shown in FIG. 2, an LED chip 100 includes a substrate 101, an n-type semiconductor layer 120, an active layer 130, a p-type semiconductor layer 140, first and second reflection plates 170a and 170b, a first electrode 150 and a second electrode 160. The p-type semiconductor layer 140 and the n-type semiconductor layer 120 form a forward-biased junction. The substrate 101 may be formed of a transparent material, such as sapphire. Alternatively, zinc oxide (ZnO), gallium nitride (GaN), silicon carbide (SiC) or aluminum nitride (AlN) may be used for the substrate 101.

The n-type semiconductor layer 120 is formed on the substrate 101. To improve a lattice junction property, a buffer layer (not shown) may be formed between the substrate 101 and the n-type semiconductor layer 120. The buffer layer may be formed of GaN or AlN/GaN. The n-type semiconductor layer 120 may be formed of GaN or GaN/AlGaN where an n-type conductive dopant is doped. For example, the n-type conductive dopant may be silicon (Si), germanium (Ga) or tin (Sn). Here, Si is generally used.

The active layer 130 is formed on the n-type semiconductor layer 120. The active layer 130 is formed of a GaN-based material such that the active layer 130 has a single quantum well structure, a multi-quantum well structure, or their super lattice structure. For example, at least one of AlGaN, AlN-GaN, InGaN may be used for the active layer 130.

The p-type semiconductor layer 140 is formed on the active layer 130. The p-type semiconductor layer 140 may be formed of GaN or GaN/AlGaN where a p-type conductive dopant is doped. For example, the p-type conductive dopant may be magnesium (Mg), zinc (Zn) or beryllium (Be). Here, Mg is used.

The p-type semiconductor layer 140 and the active layer 130 are mesa-etched to expose one portion of the n-type semiconductor layer 120. Namely, each of the p-type semiconductor layer 140 and the active layer 130 overlaps the other portion of the n-type semiconductor layer 120.

The first electrode 150 is formed over one portion of the n-type semiconductor layer 120, and the second electrode 160 is formed over the p-type semiconductor layer 140. The first and second electrodes 150 and 160 have substantially the same height from the substrate 101. This may be referred to as a top-top type arrangement. The LED chip 100 may be referred to as a horizontal type.

When voltages are applied to the second electrode 160 and the first electrode 150, holes and electrons are injected into the p-type semiconductor layer 140 and the n-type semiconductor layer 120, respectively. The holes and the electrons recombine in the active layer 130 so that light is emitted through the substrate 101.

In the LED chip 100 according to an exemplary embodiment of the present invention, the first reflection plate 170a is disposed on the n-type semiconductor layer 120 and under the first electrode 150, and the second reflection plate 170b is disposed on the p-type semiconductor layer 140 and under the second electrode 160. By using the first and second reflection plates 170a and 170b, light efficiency of the LED chip 100 is improved.

Each of the first and second reflection plates 170a and 170b is formed of a high reflective property material having a reflectivity above about 70% in a visible ray wavelength, an infrared wavelength, and an ultraviolet wavelength. Also, each of the first and second refection plates 170a and 170b should be electrically conductive if the first and second electrodes 150 and 160 are connected through the first and second reflective plates 170a and 170b. For example, silver (Ag), aluminum (Al), molybdenum (No) or chromium (Cr) may be used for the first and second reflection plates 170a and 170b. Here, the material for the first and second reflective plates 170a and 170b may be deposited as a film.

Figure 3:
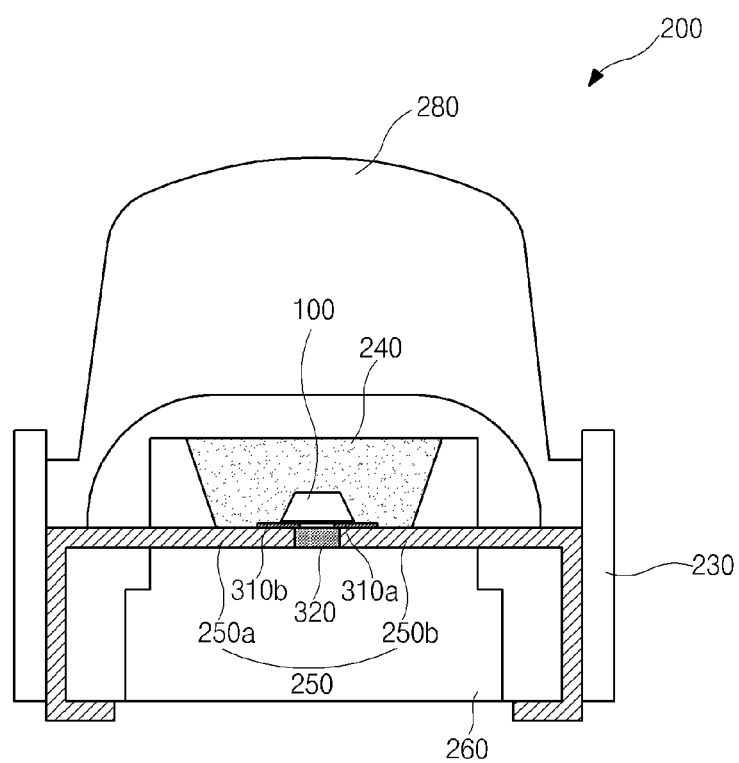
FIG. 3 is a schematic cross-sectional view of an LED package according to an exemplary embodiment of the present invention.
Figure 4:
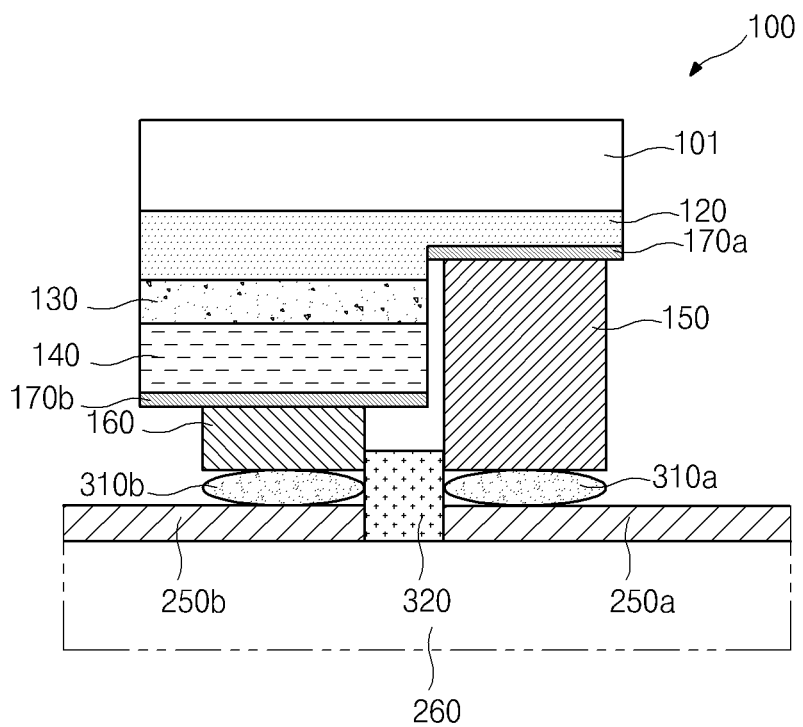
FIG. 4 is a schematic cross-sectional view showing a bonding feature of an LED chip to an LED package according to an exemplary embodiment of the present invention.

FIG. 3 is a schematic cross-sectional view of an LED package according to an exemplary embodiment of the present invention, and FIG. 4 is a schematic cross-sectional view showing a bonding feature of an LED chip to an LED package according to an exemplary embodiment of the present invention.

As shown in FIGS. 3 and 4, the LED package 200 includes a lead frame 250 including first and second lead frames 250a and 250b, a heat-transfer body 260, the LED chip 100, a case 230 as a housing and a lens 280 covering the LED chip 100.

The LED chip 100 is a horizontal type and includes the first electrode 150 (of FIG. 2) and the second electrode 160 (of FIG. 2). The LED chip 100 is disposed over the lead frame 250 in an inverted orientation as compared to the orientation of FIG. 3. The first electrode 150 and the second electrode 160 are electrically connected to the first and second lead frames 250a and 250b such that a power is provided into the LED chip 100. As a result, the LED chip 100 emits light.

Heat from the LED chip 100 is transferred to the outside through the heat-transfer body 260. The heat-transfer body 260 is formed of a thermally conductive material, such as metallic material. The heat-transfer body 260 has a space. The space of the heat-transfer body 260 is covered with the case 230 and is packed with the fluorescent particles 240. However, heat-transfer body 260 can be omitted. In this case, the fluorescent particles 240 are disposed in the case 230.

The first and second lead frames 250a and 250b may be disposed through the case 230 or the heat-transfer body 260, and one end of each of the first and second lead frames 250a and 250b protrudes from the case 230. If the heat-transfer body is used, the first and second lead frames 250a and 250 may be in contact with the heat-transfer body 260. One end of each of the first and second lead frames 250a and 250b are electrically connected to an external current supply unit to receive a driving current for the LED chip 100.

The lens 280 covers the LED chip 100, the fluorescent particles 240 and the heat-transfer body 260 and controls an angle of light from the LED chip 100. The lens controls a radiation angle of the light from each LED chip 100. The lens 280 may be classified as a high-dome emitter type, a low-dome emitter type or a side emitter type depending on their shape. The high-dome emitter type lens has a radiation angle of about 140 degrees. The low-dome emitter type lens has a radiation angle of about 110 degrees and a lower dome shape than the high-dome emitter type. The side emitter type lens has a crown shape and a radiation angle of about 200 degrees.

When the LED chip 100 emits blue light, the fluorescent particle 240 is a yellow type. For example, the yellow type fluorescent particle may be a cerium doped yttrium-aluminum-garnet $T_3Al_5O_{12}$:Ce (YAG:Ce)-based material.

When the LED chip 100 emits UV light, the fluorescent particles 240 includes red, green and blue color fluorescent particles. By controlling a relative ratio of the red, green and blue color fluorescent particles, a color of light from the LED package 200 can be controlled.

For example, the red fluorescent particles may be a $Y_2O_3$:EU (YOX)-based material as a compound of yttrium oxide ($Y_2O_3$) and europium (EU). Yttrium oxide ($Y_2O_3$) has a main wavelength of 611 nm. The green fluorescent particles may be a $LaPO_4$:Ce,Tb (LAP)-based material as a compound of phosphoric acid ($PO_4$), lanthanum (La), terbium (Tb). Phosphoric acid has a main wavelength of 544 nm. The blue fluorescent particles may be a $BaMgAl_{10}O_{17}$:EU (BAM)-based material as a compound of barium (Ba), magnesium (Mg), a aluminum oxide-based material, and europium (EU).

Barium has a main wavelength of 450 nm. The main wavelength is defined as a wavelength for generating highest luminance.

When electrical power is provided to the LED chip 100 through the lead frame 250, the LED chip 100 emits light. The fluorescent particles 240 are excited by the light from the LED chip 100 such that the light from the LED chip 100 and the light from the fluorescent particles 240 are mixed. As a result, white light is emitted through the lens 280.

In the LED package 200 according to an exemplary embodiment of FIG. 3, the LED chip 100 is electrically connected to the lead frame 250 by a eutectic bonding. Namely, the LED chip 100 is electrically connected to the lead frame 250 by a thermally pressing under a high temperature of about 200 to 700° C. to obtain strength and reliability in the bonding.

For the eutectic bonding, the lead frame 250 may be formed of one of Au/Sn, Au/Ni, Au/Ge, Au, Sn and Ni. Preferably, the lead frame 250 may be formed of a plating with one of the above materials. In addition, each of the first electrode 150 and the second electrode 160, which are eutectically bonded with the lead frame 250, may be formed of one of Au/Sn, Au/Ni, Au/Ge, Au, Sn and Ni. Preferably, each of the first electrode 150 and the second electrode 160 may be formed of a plating of one of the above material. For example, each of the first electrode 150 and the second electrode 160 may be formed of Au/Sn, and the lead frame 250 may be formed of Au. In this case, a weight ratio of Au to Sn may be 8:2. Alternatively, each of the first electrode 150 and the second electrode 160 may be formed of Au, and the lead frame 250 may be formed of Au/Sn.

When thermal pressing is performed by contacting each of the first and second electrodes 150 and 160 with the lead frame 250, a contact portion of the first electrode 150 and the lead frame 250 and a contact portion of the second electrode 160 and the lead frame 250 are melted such that a eutectic alloy is formed at an interface between the first electrode 150 and the lead frame 250 and an interface between the second electrode 160 and the lead frame 250. As a result, the first electrode 150 and the second electrode 160 are electrically connected to the first and second lead frames 250a and 250b of the lead frame 250.

The eutectic alloy has a predetermined composition ratio of Au to Sn and serves as first and second conductive adhesive films 310a and 310b. Namely, the LED chip 100 is electrically connected to the first and second lead frames 250a and 250b by the first and second conductive adhesive films 310a and 310b as the eutectic alloy.

The eutectic bonding has an excellent bonding strength and dose not require a step of coating an adhesive material. As mentioned above, the first and second electrodes 150 and 160 of the LED chip 100 are electrically connected by the eutectic bonding to the first and second lead frames 250a and 250b. Namely, the LED chip 100 has a flip-chip bonding structure on the lead frame 250.

Figure 1:
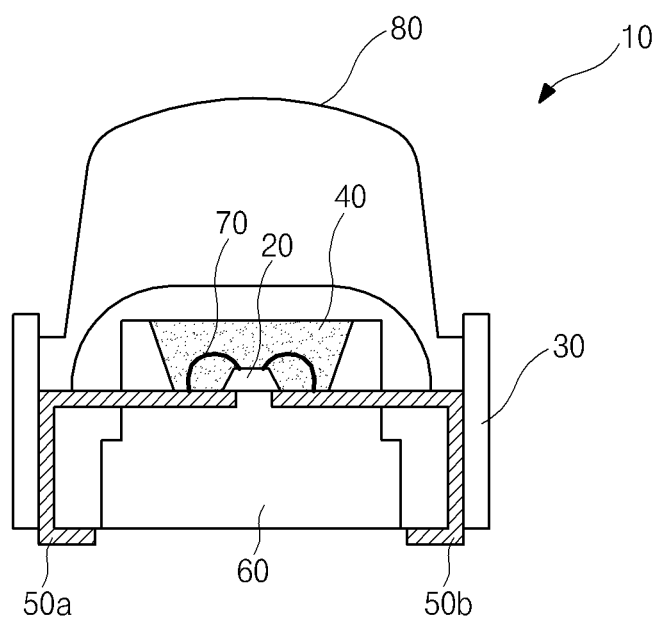
FIG. 1 is a cross-sectional view of a related art LED package.

Since the LED chip 100 receives power from an exterior current supplying unit through the lead frame 250 without the wire 70 (of FIG. 1), the open defect on the wire is avoided. In addition, a decrease in luminance efficiency caused by the wire is also avoided. Furthermore, since a bonding process, for example, a soldering process, for connecting the wires to the LED chip is not required, processing yield is improved. Moreover, since the material having a high heat-transfer property, e.g., Au/Sn, is used for the first and second electrodes, a thermal damage on the LED package is further decreased.

The LED package 200 further includes an insulating pattern 320 between the first and second lead frame 250a and 250b. The insulating pattern 320 has a thickness greater than the first and second lead frame 250a and 250b such that an electrical short between the first and second electrodes 150 and 160 is prevented. Namely, an end of the insulating pattern 320 is disposed between the first and second electrodes 150 and 160 to serve as a wall. For example, the insulating pattern 320 may be formed of at least one of $SiO_2$, $Si_3N_4$, $Al_2O_3$, $TiO_2$, $HfO_2$, $T_2O_3$, MgO and AlN.

FIGS. 5A to 5E are cross-sectional views illustrating a bonding process for an LED chip according to an exemplary embodiment of the present invention.

Figure 5A:
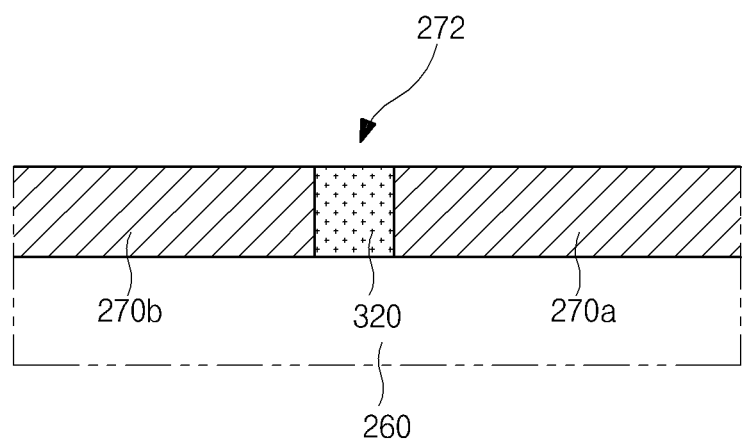
FIGS. 5A to 5E are cross-sectional view illustrating a bonding process for an LED chip according to an exemplary embodiment of the present invention.

As shown in FIG. 5A, first and second lead frame patterns 270a and 270b and the insulating pattern 320 are formed on the heat-transfer body 260. Without the heat-transfer body 260, first and second lead frame patterns 270a and 270b and the insulating pattern 320 may be formed on the case 230. Each of the first and second lead frame patterns 270a and 270b may be formed of one of Au/Sn, Au/Ni, Au/Ge, Au, Sn and Ni. The first and second lead frame patterns 270a and 270b are spaced apart from each other to expose a portion of the heat-transfer body 260. The insulating pattern 320 is disposed in a space 272 between the first and second lead frame patterns 270a and 270b. For example, after forming the first and second lead frame patterns 270a and 270b on the heat-transfer body 260, the insulating pattern 320 is formed in the space. Alternatively, after forming the insulating pattern 320 on the heat-transfer body 260, the first and second lead frame patterns 270a and 270b are formed at both sides of the insulating pattern 320, respectively. The insulating pattern 320 has substantially the same thickness as each of the first and second lead frame patterns 270a and 270b to form a flat top surface.

Figure 5B:
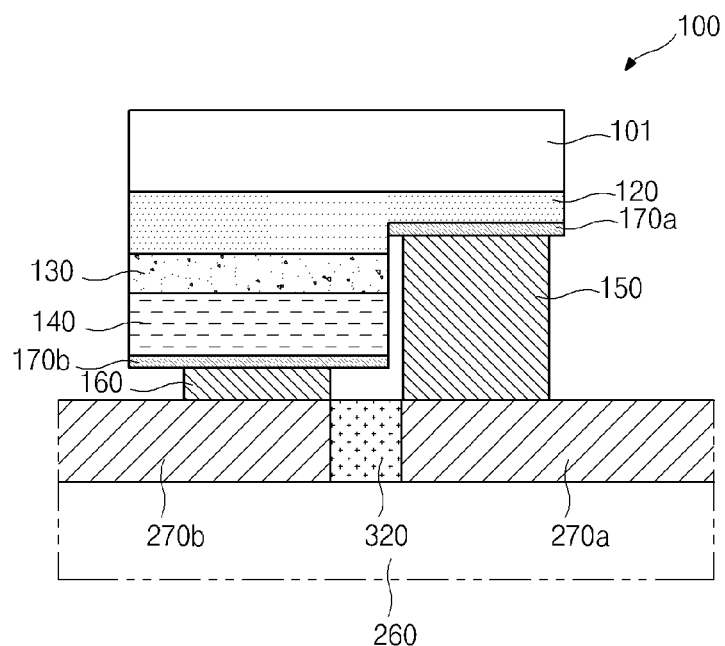

Next, as shown in FIG. 5B, the LED chip 100 is disposed over the heat-transfer body 260 such that the first and second electrodes 150 and 160 respectively contact the first and second lead frame patterns 270a and 270b and the insulating pattern 320 is positioned between the first and second electrodes 150 and 160. The LED chip 100 may be moved using a vacuum chuck, e.g., a collet chuck. As mentioned above, each of the first and second electrodes 150 and 160 may be formed of one of Au/Sn, Au/Ni, Au/Ge, Au, Sn and Ni. A width of the insulating pattern 320 is equal to or smaller than a distance between the first and second electrodes 150 and 160.

Figure 5C:
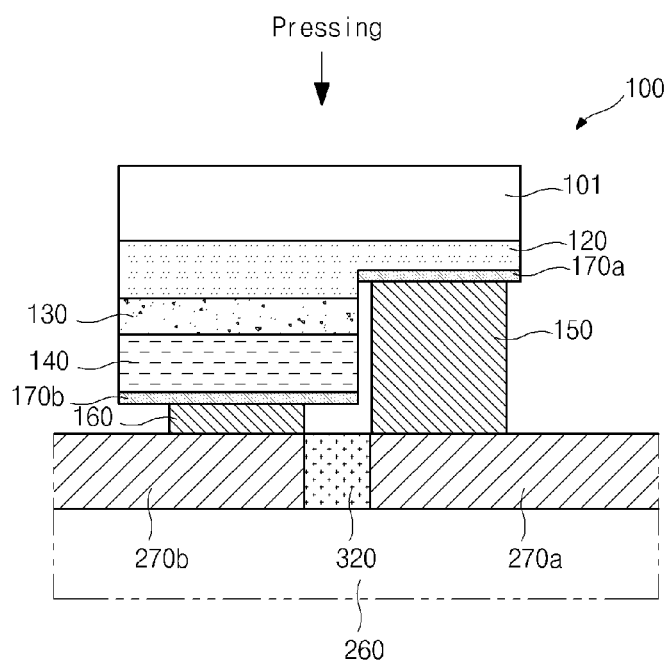

Next, as shown in FIG. 5C, to fix the LED chip 100 on the first and second lead frame patterns 270a and 270b, the LED chip 100 is pressed using a pressing apparatus, e.g., a capillary.

Figure 5D:
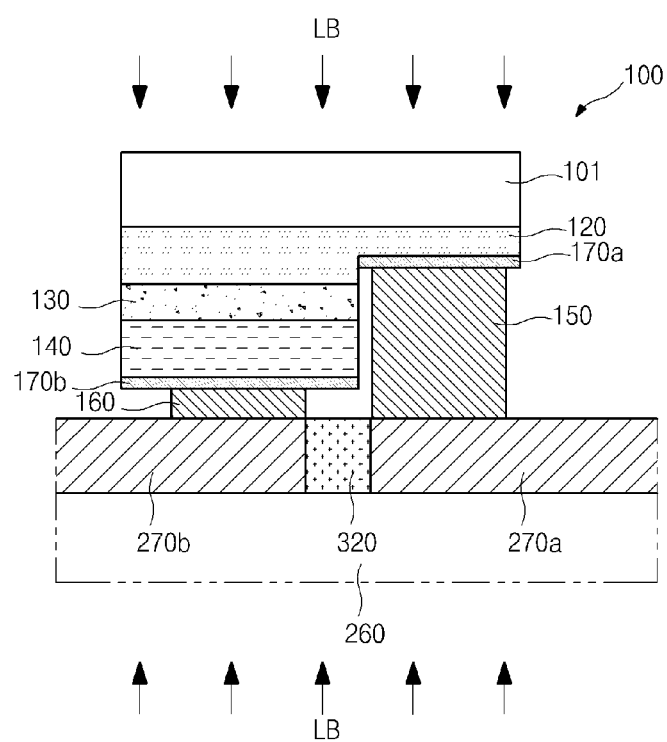

Next, as shown in FIG. 5D, by irradiating a laser beams LB onto a front side and a rear side of the LED chip such that a contact portion between the first lead frame pattern 270a and the first electrode 150 and a contact portion between the second lead frame pattern 270b and the second electrode 160 are heated. Alternatively, one laser beam LB may be employed onto one of the front side and rear side of the LED chip.

Figure 5E:
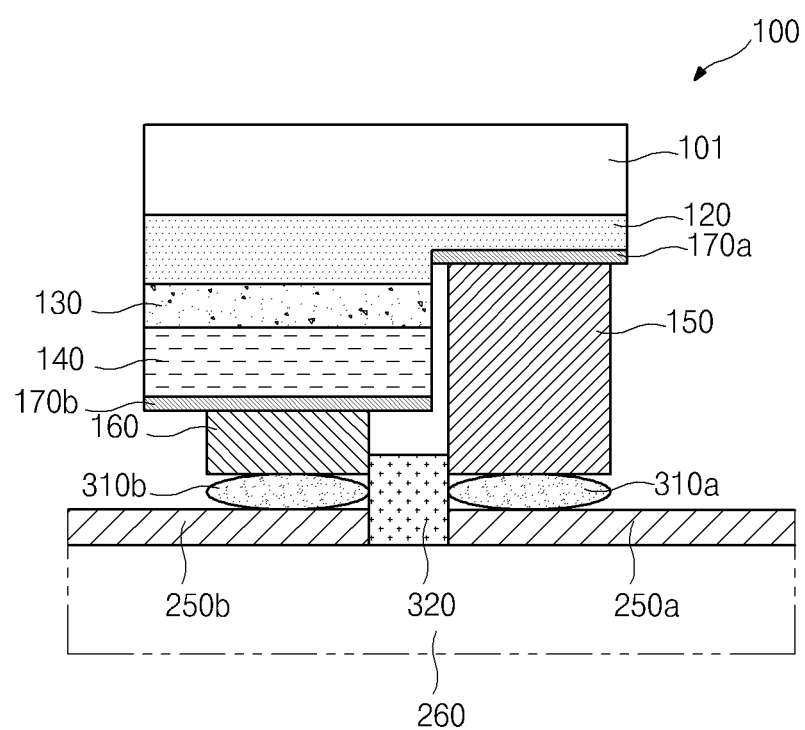

As a result, eutectic bonding is generated between the first lead frame pattern 270a and the first electrode 150 and the second lead frame pattern 170b and the second electrode 160. A thickness of each of the first and second lead frame patterns 270a and 270b is reduced by the eutectic bonding reaction to form the first and second lead frame 250a and 250b, as shown in FIG. 5E. In addition, since the thickness of each of the first and second lead frame patterns 270a and 270b is reduced by the eutectic bonding reaction, the insulating pattern 320 has a thickness greater than each of the first and second lead frames 250a and 250b and is disposed between the first and second electrodes 150 and 160 to serve as a wall. Through the eutectic bonding reaction, the first and second conductive adhesive films 310a and 310b are formed between the first lead frame pattern 270a and the first electrode 150 and between the second lead frame pattern 270b and the second electrode 160, respectively. Due to the first and second conductive adhesive films 310a and 310b, the first and second electrodes 150 and 160 of the LED chip 100 are electrically connected to the first and second lead frames 250a and 250b, respectively.

The pressing step and the laser beam irradiation step may be simultaneously performed.

The laser beams LB may be an infra-red laser beam. For example, a YAG type laser source having a wavelength of 1064 nm may be used. The laser beams are irradiated during about 0.01 to about 1 sec. A temperature at a contact portion between the first lead frame pattern 270a and the first electrode 150 and a contact portion of the second lead frame pattern 270b and the second electrode 160 may be about 200 to 700° C. during the heating process.

In accordance with exemplary embodiments of the present invention, since a contact portion between the first lead frame pattern 270a and the first electrode 150 and a contact portion of the second lead frame pattern 270b and the second electrode 160 is momentarily and locally heated by the laser beam LB, thermal damage on the LED chip is minimized. Since the LED chip 100 receives power from the exterior current supplying unit (not shown) through the lead frame 250 without the use of the wire 70 (of FIG. 1), the open defect on the wire is avoided. In addition, a decrease in luminance efficiency caused by the wire is also avoided. Furthermore, since a bonding process, for example, a soldering process, for connecting the wires to the LED chip is not required, processing yield is improved. Moreover, since the material having a high heat-transfer property, e.g., Au/Sn, is used for the first and second electrodes, a thermal damage on the LED package is further decreased.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a light emitting diode (LED) package, comprising:
    forming a case having first and second lead frames on a surface thereof;
    forming a LED chip having a transparent substrate, a LED structure, a first electrode and a second electrode;
    positioning the LED chip on the case such that the first and second electrodes directly contact the first and second lead frames;
    irradiating electromagnetic radiation onto the contact portion between the first electrode and the first lead frame as well as the second electrode and the second lead frame to generate eutectic bonding,
    wherein the step of forming the case includes forming an insulator, which has substantially the same height as the first and second lead frames from the surface of the case, disposed on the surface the case and between the first and second lead frames, and the insulator protrudes from the first and second lead frames by the step of irradiating the electromagnetic radiation.

2. The method according to claim 1, wherein the step of forming the LED chip further includes forming the first and second electrodes having substantially the same height from the substrate.

3. The method according to claim 1, wherein the step of irradiating electromagnetic radiation includes a irradiating at least one laser beam onto the contact portion.

4. The method according to claim 3, wherein laser beams are irradiated from front and rear sides of the LED chip.

5. The method according to claim 1, wherein the step of irradiating electromagnetic radiation generates heat at the contact portion to generate eutectic bonding.

6. The method according to claim 1, wherein the first and second electrodes of the LED chip and the first and second lead frames of the case are pressed together while irradiating the contact portion with electromagnetic radiation.

7. The method according to claim 1, wherein the step of forming the LED structure includes:
    preparing a substrate formed of a transparent material;
    forming a first semiconductor layer of a first conductivity type disposed on the substrate;
    forming an active layer formed on the first semiconductor layer;
    forming a second semiconductor layer of a second conductivity type;
    wherein the active layer and the second semiconductor layer have a width less than first semiconductor layer to be absent from a portion of the first semiconductor layer.

8. The method according to claim 7, wherein the first electrode is disposed on the first semiconductor layer at the portion where the active layer and the second semiconductor layer are absent, and the second electrode is disposed on the second semiconductor layer.

9. The method according to claim 8, wherein the step of forming the LED chip further includes forming a first reflective plate between the first electrode and the first semiconductor layer, and forming a second reflective plate between the second electrode and the second semiconductor layer.

10. The method according to claim 9, wherein the first and second reflective plates include metal thin films.

11. The method of according to claim 1, wherein the insulator has substantially the same thickness as the first and second frames before the step of irradiating the electromagnetic radiation, and the thickness of the insulator is greater than those of the first and second frames after the step of irradiating the electromagnetic radiation.

\* \* \* \* \*